US011150760B2

(12) United States Patent
Cheng

(10) Patent No.: US 11,150,760 B2
(45) Date of Patent: Oct. 19, 2021

(54) TOUCH ANALOG FRONT-END CIRCUIT AND TOUCH DISPLAY APPARATUS THEREOF

(71) Applicant: Novatek Microelectronics Corp., Hsinchu (TW)

(72) Inventor: Yen-Cheng Cheng, Hsinchu (TW)

(73) Assignee: Novatek Microelectronics Corp., Hsinchu (TW)

( * ) Notice: Subject to any disclaimer, the term of this patent is extended or adjusted under 35 U.S.C. 154(b) by 0 days.

(21) Appl. No.: 16/992,140

(22) Filed: Aug. 13, 2020

(65) Prior Publication Data

US 2021/0048913 A1   Feb. 18, 2021

Related U.S. Application Data

(60) Provisional application No. 62/886,969, filed on Aug. 15, 2019.

(51) Int. Cl.
| | | |
|---|---|---|
| *G06F 3/041* | (2006.01) | |
| *H03F 1/34* | (2006.01) | |
| *H03F 3/68* | (2006.01) | |

(52) U.S. Cl.
CPC .......... *G06F 3/0416* (2013.01); *G06F 3/0412* (2013.01); *H03F 1/34* (2013.01); *H03F 3/68* (2013.01)

(58) Field of Classification Search
CPC ........ G06F 3/0416; G06F 3/0412; G06F 3/05; H03F 3/68; H03F 1/34
See application file for complete search history.

(56) References Cited

U.S. PATENT DOCUMENTS

| | | | | |
|---|---|---|---|---|
| 10,481,731 | B2* | 11/2019 | Dinu | G06F 3/04184 |
| 10,955,951 | B2* | 3/2021 | Lee | G02F 1/136286 |
| 2013/0335376 | A1* | 12/2013 | Lee | G06F 3/04166 |
| | | | | 345/174 |
| 2014/0077823 | A1* | 3/2014 | Angelini | G01R 27/2605 |
| | | | | 324/658 |
| 2014/0292375 | A1* | 10/2014 | Angelini | G03G 7/00 |
| | | | | 327/94 |
| 2015/0212643 | A1* | 7/2015 | Lee | G06F 3/0446 |
| | | | | 345/174 |
| 2020/0192520 | A1* | 6/2020 | Guedon | G06F 3/044 |

\* cited by examiner

*Primary Examiner* — Liliana Cerullo
(74) *Attorney, Agent, or Firm* — JCIPRNET

(57) ABSTRACT

A touch analog front-end circuit includes a current conveyor and an accumulator. The current conveyor receives a first voltage as an operation voltage, and generates a current signal according to a touch sensing signal received from a touch display panel. The accumulator is coupled to the current conveyor, receives a second voltage as an operation voltage, and generates an accumulating result according to the current signal and a reference voltage. The first voltage is higher than the second voltage.

14 Claims, 2 Drawing Sheets

US 11,150,760 B2

TOUCH ANALOG FRONT-END CIRCUIT AND TOUCH DISPLAY APPARATUS THEREOF

CROSS-REFERENCE TO RELATED APPLICATION

This application claims the priority benefit of U.S. provisional application Ser. No. 62/886,969, filed on Aug. 15, 2019. The entirety of the above-mentioned patent applications is hereby incorporated by reference herein and made a part of this specification.

BACKGROUND

Field of the Invention

The invention relates to a touch analog front-end circuit and a touch display apparatus thereof for reducing power consumption.

Description of Related Art

In a conventional touch display device, a data driving circuit is disposed for generating a plurality of data voltages for driving display pixels of a touch display panel, where a part of the data voltages are positive polarity and another part of the data voltages are negative polarity, and a plurality of touch analog front-end (AFE) circuits are disposed and configured to process touch sensing signals from touch sensors on the touch display panel. Power consumption of each touch AFE circuit is dependent upon a same voltage range, which is usually a half of a supply voltage range of the data driving circuit and is still a large consumption.

SUMMARY

The invention provides a touch analog front-end circuit that can save more power and a touch display apparatus thereof.

According to an embodiment of the invention, the touch analog front-end circuit includes a current conveyor and an accumulator. The current conveyor receives a first voltage as an operation voltage, and generates a current signal according to a touch sensing signal received from a touch display panel. The accumulator is coupled to the current conveyor, receives a second voltage as an operation voltage, and generates an accumulating result according to the current signal and a reference voltage. The first voltage is higher than the second voltage.

According to another embodiment of the invention, the touch display apparatus includes a display panel and a touch display driving device. The display panel is integrated with a touch sensor array, wherein the touch sensor array includes a plurality of touch electrodes. The touch display driving device includes a plurality of touch analog front-end circuits for processing a plurality of touch sensing signal from the touch sensor array. Each touch analog front-end circuit includes a current conveyor and an accumulator. The current conveyor is coupled to a touch electrode of the touch sensor array for receiving a touch sensing signal from the touch electrode, receives a first voltage as an operation voltage, and generates a current signal according to the touch sensing signal. The accumulator is coupled to the current conveyor, receives a second voltage as an operation voltage, and generates an accumulating result according to the current signal and a reference voltage. The first voltage is higher than the second voltage.

To sum up, the accumulator of the touch analog front-end circuit is operated on the second voltage which has lower voltage value. Power consumption of the accumulator can be reduced and power consumption of the touch analog front-end circuit can be reduced accordingly.

To make the above features and advantages of the invention more comprehensible, embodiments accompanied with drawings are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF EMBODIMENTS

Figure 1:
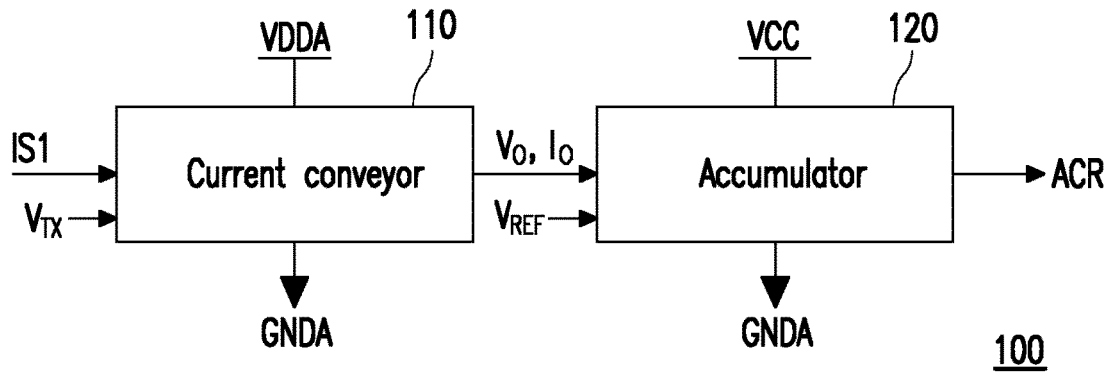
FIG. 1 is a schematic diagram of a touch analog front-end circuit according to an embodiment of present disclosure.

The term "couple (or connect)" throughout the specification (including the claims) of this application are used broadly and encompass direct and indirect connection or coupling means. For instance, if the disclosure describes a first apparatus being coupled (or connected) to a second apparatus, then it should be interpreted that the first apparatus can be directly connected to the second apparatus, or the first apparatus can be indirectly connected to the second apparatus through other devices or by a certain coupling means. In addition, terms such as "first" and "second" mentioned throughout the specification (including the claims) of this application are only for naming the names of the elements or distinguishing different embodiments or scopes and are not intended to limit the upper limit or the lower limit of the number of the elements not intended to limit sequences of the elements. Moreover, elements/components/steps with same reference numerals represent same or similar parts in the drawings and embodiments. Elements/components/notations with the same reference numerals in different embodiments may be referenced to the related description.

Please refer to FIG. 1, which is a schematic diagram of a touch analog front-end circuit according to an embodiment of present disclosure. The touch analog front-end circuit 100 includes a current conveyor 110 and an accumulator 120. The current conveyor 110 receives a first voltage VDDA as an operation voltage, and receives a reference ground voltage GNDA. The current conveyor 110 further receives an input signal IS1 and a touch driving signal (or called touch excitation signal) $V_{TX}$. The current conveyor 110 generates a current signal $I_O$ according to the input signal IS1 and the touch driving signal $V_{TX}$. The accumulator 120 is coupled to the current conveyor 110. The accumulator 120 receives the current signal $I_O$ as an input, receives a second voltage VCC as an operation voltage and further receives the reference ground voltage GNDA. The accumulator 120 is a current accumulator. The accumulator 120 generates an accumulating result ACR according to the current signal $I_O$ and a reference voltage VREF. An output DC voltage $V_O$ of the current conveyor 110 (which is a voltage at a node where the current signal $I_O$ is input to the accumulator 120) may equal to the reference voltage $V_{REF}$. In other words, the output DC voltage $V_O$ of the current conveyor 210 is determined based on the reference voltage $V_{REF}$. It should be noted here, the first voltage VDDA is higher than the second voltage VCC, and the current conveyor 110 and the accumulator 120 receive the same reference ground voltage GNDA. By applying an operation voltage lower than the operation voltage of the current conveyor 110, the difference between the operation voltage (VCC) of the accumulator 120 and the reference ground voltage GNDA of the accumulator 120 is reduced and power consumption of the accumulator 120 can be reduced. If an operation current of the accumulator 120 is IC, the reference ground voltage GNDA is 0V, the power consumption of the accumulator 120 equals IC×VCC which is lower than IC×VDDA.

In this embodiment, the touch driving signal $V_{TX}$ can be a periodic pulse signal. The touch driving signal $V_{TX}$ may be provided by an external signal generation source, and transited below the first voltage VDDA. The current conveyor 110 may generates the current signal $I_O$ by conveying a current part of the input signal IS1 based on the touch driving signal $V_{TX}$.

Further, the reference voltage $V_{REF}$ received by the accumulator 120 may be pre-set according to the second voltage VCC, and provided by an external electronic device. In one embodiment of this disclosure, the reference voltage $V_{REF}$ may equal to ½ (VCC+GNDA). If the reference ground voltage GNDA is 0V, the reference voltage $V_{REF}$ is equivalent to a half of the second voltage VCC. Moreover, the accumulator 120 may accumulate a difference between the current signal $I_O$ and the reference voltage $V_{REF}$ to generate the accumulating result ACR.

Figure 2:
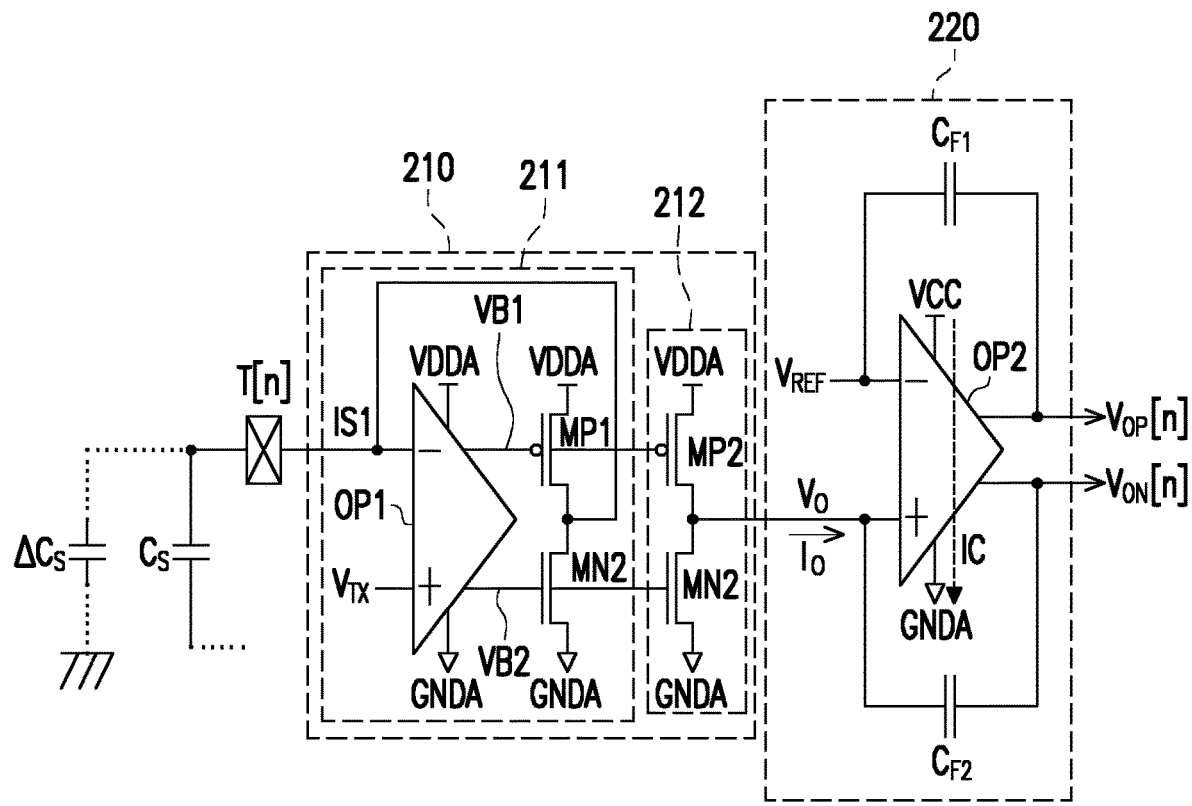
FIG. 2 is a schematic diagram of a touch analog front-end circuit according to another embodiment of present disclosure.

Please refer to FIG. 2, which is a schematic diagram of a touch analog front-end circuit according to another embodiment of present disclosure. The touch analog front-end circuit 200 includes a current conveyor 210 and an accumulator 220. The current conveyor 210 includes a voltage follower 211 and a buffer 212. The voltage follower 211 includes an operation amplifier OP1, wherein the operation amplifier OP1 includes an output stage circuit including transistors MP1 and MN1. The operation amplifier OP1 has a positive input end for receiving a touch driving signal $V_{TX}$, a negative input end coupled to a touch electrode T[n] for receiving an input signal IS1, where the input signal IS1 may be varied according to a capacitance variation $\Delta C_S$ of a capacitor $C_S$ on the touch electrode T[n].

It should be noted here, the operation amplifier OP1 receives a first voltage VDDA as an operation voltage, and receives a reference ground voltage GNDA.

About the output stage circuit of the operation amplifier OP1, in detail, the transistor MP1 and MN1 are coupled in series between the first voltage VDDA and the reference ground voltage GNDA. A first end of the transistor MP1 receives the first voltage VDDA, a second end of the transistor MP1 is coupled to a first end of the transistor MN1, and a second end of the transistor MN1 received the reference ground end GNDA. Control ends of the transistor MP1 and MN1 respectively receives bias voltages VB1 and VB2 generated by the operation amplifier OP1. Furthermore, the second end of the transistor MP1 and the first end of the transistor MN1 are coupled to the negative input end of the operation amplifier OP1 to form a feedback path. In this embodiment, the transistor MP1 may be a P-type transistor, and the transistor MN1 may be a N-type transistor.

The buffer 212 includes transistors MP2 and MN2. A first end of the transistor MP2 receives the first voltage VDDA, a second end of the transistor MP2 is coupled to a first end of the transistor MN2, and a second end of the transistor MN2 receives the reference ground voltage GNDA. Control ends of the transistors MP2 and MN2 respectively receive the bias voltages VB1 and VB2, and the second end of the transistor MP2 and the first end of the transistor MN2 output a current signal $I_O$.

On the other hand, the accumulator 220 includes an operation amplifier OP2 and capacitors $C_{F1}$ and $C_{F2}$. The operation amplifier OP2 receives a second voltage VCC as an operation voltage, and receives the reference ground voltage GNDA. A negative input end of the operation amplifier OP2 receives a reference voltage $V_{REF}$, and a positive input end of the operation amplifier OP2 is coupled to the current conveyor 210 for receiving the current signal $I_O$. The voltage of the positive input end of the operation amplifier OP2 is an output DC voltage $V_O$ of the current conveyor 210, which equals to the reference voltage $V_{REF}$. In other words, the output DC voltage $V_O$ of the current conveyor 210 is determined based on the reference voltage $V_{REF}$. Furthermore, the capacitor $C_{F1}$ is coupled between a first output end and the negative input end of the operation amplifier OP2, and the capacitor $C_{F2}$ is coupled between a second output end and the positive input end of the operation amplifier OP2. The first output end and the second output end of the operation amplifier OP2 respectively output accumulating signals $V_{OP}[n]$ and $V_{ON}[n]$, where the accumulating signals $V_{OP}[n]$ and $V_{ON}[n]$ may be differential signals, and a difference between the accumulating signals $V_{OP}[n]$ and $V_{ON}[n]$ is the accumulating result of the accumulator 220.

In here, an operation current IC of the operation amplifier OP2 flows through the second voltage VCC and the reference ground voltage GNDA, and power consumption of the accumulator 220 equals IC×VCC which is lower than IC×VDDA, if the reference ground voltage GNDA is 0V.

Figure 3:
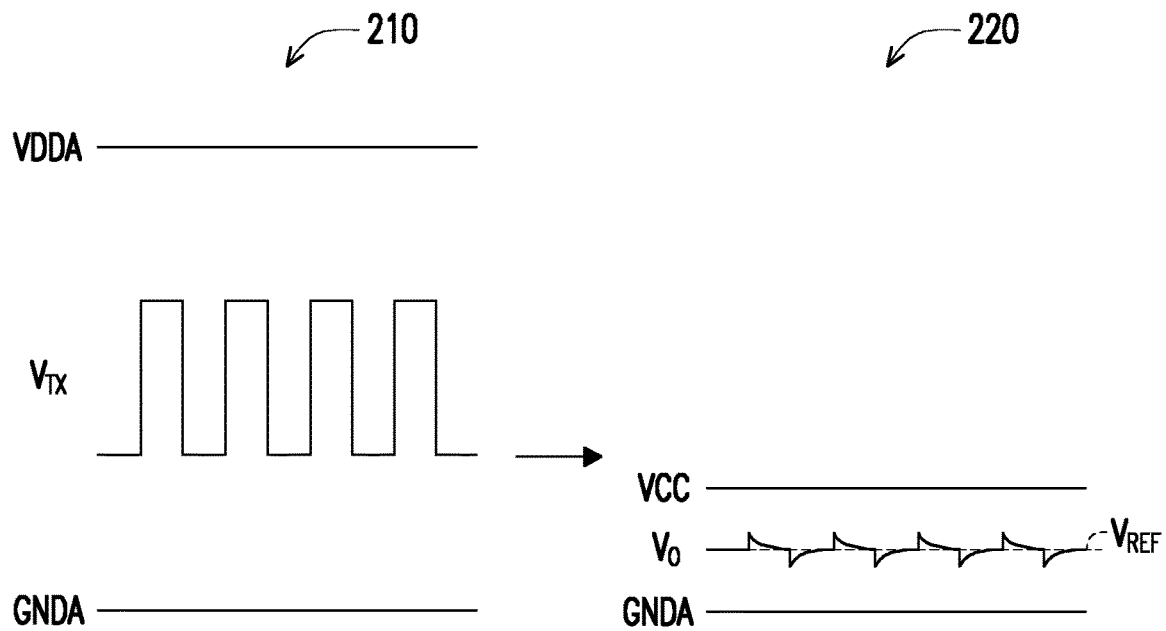
FIG. 3 is a waveform plot of the touch analog front-end circuit according to the embodiment in FIG. 2 of present disclosure.

Please refer to FIG. 2 and FIG. 3, wherein FIG. 3 is a waveform plot of the touch analog front-end circuit according to the embodiment in FIG. 2 of present disclosure. In FIG. 3, the current conveyor 210 is operated based on the first voltage VDDA and the reference ground voltage GNDA, wherein the first voltage VDDA is higher than the reference ground voltage GNDA. The touch driving signal $V_{TX}$ received by the current conveyor 210 is transited between the first voltage VDDA and the reference ground voltage GNDA.

On the other hand, the accumulator 220 is operated based on the second voltage VCC and the reference ground voltage GNDA, wherein the second voltage VCC is lower than the first voltage VDDA, and the second voltage VCC is higher than the reference ground voltage GNDA. Furthermore, the reference voltage $V_{REF}$ is set to be lower than the second voltage VCC and higher than the reference ground voltage GNDA, and the current signal $V_O$ can be transited between the second voltage VCC and the reference ground voltage GNDA. In one embodiment, the reference ground voltage GNDA may be 0V, and the reference voltage $V_{REF}$ may be set to equivalent to a half of the second voltage VCC. By operation of the operation amplifier OP2, in a steady state, a voltage level of the current signal $I_O$ (which is the output voltage of the current conveyor 210) can be equivalent to the reference voltage $V_{REF}$. Such as that, in an unsteady state, the voltage level of the current signal $I_O$ may be varied based on the reference voltage $V_{REF}$. Accordingly, power consumption of the accumulator 220 can be reduced to VCC× IC.

In present embodiment, the current conveyor 210 is operated based on the first voltage VDDA, and electronic components (such as the operation amplifier OP1 and the transistors MP1, MP2, MN1 and MN2) have a first withstand voltage. The accumulator 220 is operated based on the second voltage VCC, and electronic components (such as the operation amplifier OP2 and the capacitors $C_{F1}$ and $C_{F2}$) have a second withstand voltage. Since the first voltage VDDA is higher than the second voltage VCC, the second withstand voltage is lower than the first withstand voltage. Such as that, a circuit size of the accumulator 220 can be reduced, and prime cost of the touch analog front-end circuit 200 can be reduced, too.

Figure 4:
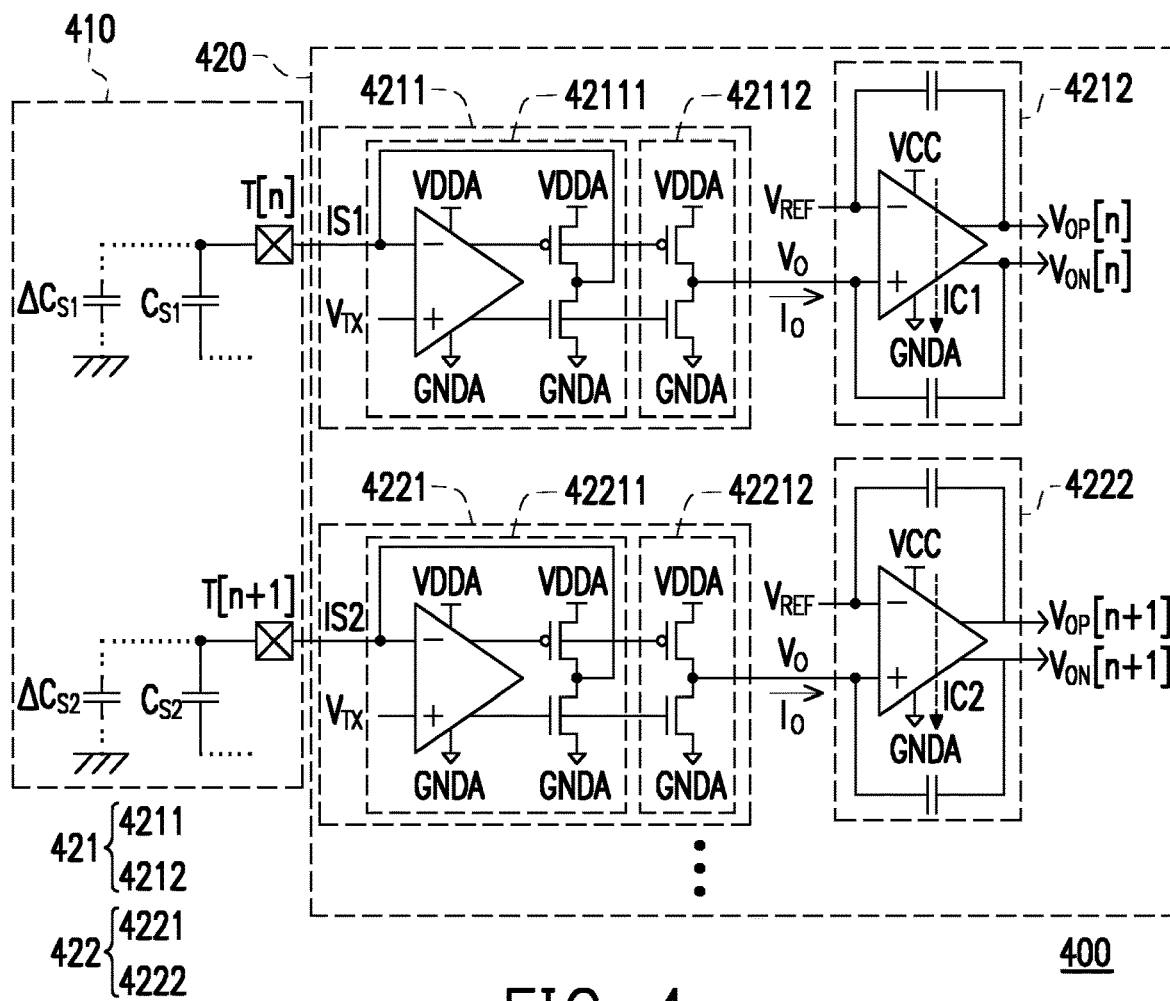
FIG. 4 is a schematic diagram of a touch display apparatus according to an embodiment of present disclosure.

Please refer to FIG. 4, which is a schematic diagram of a touch display apparatus according to an embodiment of present disclosure. The touch display apparatus 400 includes a display panel 410 and a touch display driving device 420. The display panel 410 integrated with a touch sensor array, called a touch display panel, wherein the touch sensor array includes a plurality of touch electrodes, including T[n] and T[n+1]. In here, display pixels are not illustrated in FIG. 4, and the display pixels in the display panel 410 may be arranged by a scheme known by a person skilled in this art, no special limitation here.

The touch display driving device 420 includes a plurality of touch analog front-end circuits 421 and 422. The touch analog front-end circuit 421 includes a current conveyor 4211 and an accumulator 4212. The current conveyor 4211 includes a voltage follower 42111 and a buffer 42112. Besides, the touch analog front-end circuit 422 includes a current conveyor 4221 and an accumulator 4222. The current conveyor 4221 includes a voltage follower 42211 and a buffer 42212.

It should be noted here, circuit structures of the touch analog front-end circuits 421 and 422 are the same, and the circuit structure of each of the touch analog front-end circuits 421 and 422 is equivalent to the touch analog front-end circuit 200 in the embodiment of FIG. 2.

The touch analog front-end circuits 421 and 422 are respectively coupled to the touch electrodes T[n] and T[n+1]. Input signals IS1 and IS2 are generated according to capacitance variations $\Delta C_{S1}$ and $\Delta C_{S2}$ of capacitors $C_{S1}$ and $C_{S2}$ on the touch electrodes T[n] and T[n+1], respectively. The touch analog front-end circuits 421 and 422 respectively receive the input signals IS1 and IS2, and respectively generate accumulating signals $V_{OP}[n]$, $V_{OP}[n]$ and $V_{OP}[n+1]$, $V_{OP}[n+1]$.

In present embodiment, the accumulators 4212 and 4222 are operated based on the second voltage VCC which is lower than the first voltage VDDA. That is, power consumption of the accumulator 4212 (=VCC×IC1) and power consumption of the accumulator 4222 (=VCC×IC2) can be reduced, where the IC1 and IC2 are operation currents of the accumulator 4212 and 4222, respectively.

In summary, the touch analog front-end circuit of present embodiment provides the accumulator operating based on the second voltage which is lower than the first voltage received by the current conveyor. By reducing operation voltage, power consumption of the accumulator can be reduced. Furthermore, the accumulator can be constructed by electronic components with lower withstand voltage, and circuit size of the accumulator can be reduced correspondingly for reducing prime cost of the touch analog front-end circuit.

It will be apparent to those skilled in the art that various modifications and variations can be made to the structure of the disclosed embodiments without departing from the scope or spirit of the disclosure. In view of the foregoing, it is intended that the disclosure cover modifications and variations of this disclosure provided they fall within the scope of the following claims and their equivalents.

What is claimed is:

1. A touch analog front-end circuit, comprising:
    a current conveyor, receiving a first voltage as an operation voltage, and generating a current signal according to a touch sensing signal received from a touch display panel;
    an accumulator, coupled to the current conveyor, receiving a second voltage as an operation voltage, and generating an accumulating result according to the current signal and a reference voltage,
    wherein the first voltage is higher than the second voltage.

2. The touch analog front-end circuit as claimed in claim 1, wherein the reference voltage is lower than the second voltage.

3. The touch analog front-end circuit as claimed in claim 2, wherein the reference voltage is equivalent to a half of the second voltage.

4. The touch analog front-end circuit as claimed in claim 1, wherein the current conveyor comprises:
    a voltage follower, having a negative input end for receiving the touch sensing signal, a positive input end for receiving a touch driving signal, and an output end coupled to the negative input end, wherein the voltage follower generates the current signal, and wherein the voltage follower comprises an output stage circuit coupled to a first bias voltage and a second bias voltage; and
    a buffer, coupled to the first bias voltage and the second bias voltage, and transferring the current signal to the accumulator.

5. The touch analog front-end circuit as claimed in claim 4, wherein the output stage circuit of the operational amplifier comprises:
    a first transistor, having a first end receiving the first voltage, a second end coupled to the negative input end of the operation amplifier, and a control end receiving the first bias voltage; and
    a second transistor, having a first end coupled to the second end of the first transistor, a second end coupled to a reference ground end, and a control end receiving the second bias voltage.

6. The touch analog front-end circuit as claimed in claim 4, wherein the buffer comprises:
    a first transistor, having a first end receiving the first voltage, a second end generating the current signal, and a control end receiving the first bias voltage; and
    a second transistor, having a first end coupled to the second end of the first transistor, a second end coupled to a reference ground end, and a control end receiving the second bias voltage.

7. The touch analog front-end circuit as claimed in claim 1, wherein the accumulator comprises:
    an operation amplifier, having a negative input end for receiving the reference voltage, a positive input end for receiving the current signal, a first output end for outputting a first accumulating signal, and a second output end for outputting a second accumulating signal, wherein the accumulating result is a difference between the first accumulating signal and the second accumulating signal;
a first capacitor, coupled between the first output end and the negative input end of the operation amplifier; and
a second capacitor, coupled between a second output end and the positive input end of the operation amplifier.

8. The touch analog front-end circuit as claimed in claim 1, wherein electronic components of the current conveyor have a first withstand voltage, electronic components of the accumulator have a second withstand voltage, and the second withstand voltage is lower than the first withstand voltage.

9. A touch display apparatus, comprising:
a display panel, integrated with a touch sensor array, wherein the touch sensor array comprises a plurality of touch electrodes; and
a touch display driving device, comprising a plurality of touch analog front-end circuits for processing a plurality of touch sensing signal from the touch sensor array, wherein each touch analog front-end circuit comprises:
a current conveyor, coupled to a touch electrode of the touch sensor array for receiving a touch sensing signal from the touch electrode, receiving a first voltage as an operation voltage, and generating a current signal according to the touch sensing signal and a touch driving signal;
an accumulator, coupled to the current conveyor, receiving a second voltage as an operation voltage, and generating an accumulating result according to the current signal and a reference voltage,
wherein the first voltage is higher than the second voltage, and the touch driving signal comprises a periodic pulse signal.

10. The touch display apparatus as claimed in claim 9, wherein the reference voltage is lower than the second voltage.

11. The touch display apparatus as claimed in claim 10, wherein the reference voltage is equivalent to a half of the second voltage.

12. The touch display apparatus as claimed in claim 10, wherein the current conveyor comprises:
a voltage follower, having a negative input end for receiving the touch sensing signal, a positive input end for receiving a touch driving signal, and an output end coupled to the negative input end, wherein the voltage follower comprises an output stage circuit coupled to a first bias voltage and a second bias voltage; and
a buffer, coupled to the first bias voltage and the second bias voltage, and transferring the current signal to the accumulator.

13. The touch display apparatus as claimed in claim 9, wherein the accumulator comprises:
an operation amplifier, having a negative input end for receiving the reference voltage, a positive input end for receiving the current signal, and a first output end for outputting a first accumulating signal;
a first capacitor, coupled between the first output end and the negative input end of the operation amplifier; and
a second capacitor, coupled between a second output end and the positive input end of the operation amplifier,
wherein the second output end outputs a second accumulating signal, and the first accumulating signal and the second accumulating signal are differential signals.

14. The touch display apparatus as claimed in claim 9, wherein electronic components of the current conveyor have a first withstand voltage, electronic components of the accumulator have a second withstand voltage, and the second withstand voltage is lower than the first withstand voltage.

* * * * *